United States Patent [19]
Abe

[11] Patent Number: 5,716,864
[45] Date of Patent: Feb. 10, 1998

[54] METHOD OF MANUFACTURING A NON-VOLATILE SEMICONDUCTOR MEMORY DEVICE WITH PERIPHERAL TRANSISTOR

[75] Inventor: Hirofumi Abe, Tokyo, Japan

[73] Assignee: NKK Corporation, Japan

[21] Appl. No.: 589,583

[22] Filed: Jan. 22, 1996

Related U.S. Application Data

[63] Continuation-in-part of Ser. No. 504,312, Jul. 20, 1995, abandoned.

[30] Foreign Application Priority Data

Jul. 22, 1994 [JP] Japan .................. 6-191284

[51] Int. Cl.$^6$ .................................. H01L 21/8247
[52] U.S. Cl. .................. 437/43; 437/191; 437/45
[58] Field of Search .................. 437/43, 44, 45, 437/49, 191

[56] References Cited

U.S. PATENT DOCUMENTS

| | | | |
|---|---|---|---|
| 4,142,926 | 3/1979 | Morgan | 437/43 |
| 4,775,642 | 10/1988 | Chang et al. | 437/43 |
| 5,036,018 | 7/1991 | Mazzali | 437/43 |
| 5,158,902 | 10/1992 | Hanada | 437/45 |
| 5,175,120 | 12/1992 | Lee | 437/48 |
| 5,188,976 | 2/1993 | Kume et al. | 437/43 |
| 5,223,451 | 6/1993 | Uemura et al. | 437/48 |
| 5,449,634 | 9/1995 | Inoue | 437/43 |

FOREIGN PATENT DOCUMENTS

| | | |
|---|---|---|
| 0 301 363 | 2/1989 | European Pat. Off. |
| 0 421 446 A2 | 4/1991 | European Pat. Off. |
| 0 682 364 A1 | 11/1995 | European Pat. Off. |
| 60-244123 | 12/1985 | Japan |
| 62-150781 | 7/1987 | Japan |
| 64-45161 | 2/1989 | Japan |
| 3-124057 | 5/1991 | Japan |
| 4-348072 | 12/1992 | Japan |
| 5-218350 | 8/1993 | Japan |
| 8-64706 | 3/1996 | Japan |

*Primary Examiner*—Chandra Chaudhari
*Attorney, Agent, or Firm*—Nixon & Vanderhye

[57] ABSTRACT

A first insulating film for the formation of a gate insulating film is formed on a semiconductor substrate having a memory cell forming region and a peripheral transistor forming region. A first conductive film for the formation of a floating gate is formed on the first insulating film, and a second insulating film is formed on the first conductive film. A second conductive film is formed on the second insulating film for protecting the second insulating film, and a protective film performing the functions of an oxidation-resistant film, a washing-resistant film and an etching resistant film is formed on the second conductive film. Then, the peripheral transistor region is subjected to a predetermined process. A third conductive film, which will become a control gate of the memory cell and a gate of the peripheral transistor, is formed on the second conductive film and the peripheral transistor forming region subjected to the predetermined process.

53 Claims, 6 Drawing Sheets

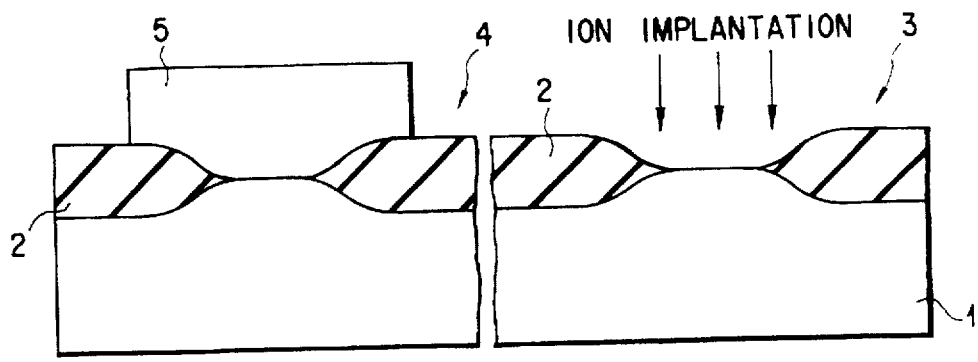
F I G. 1A
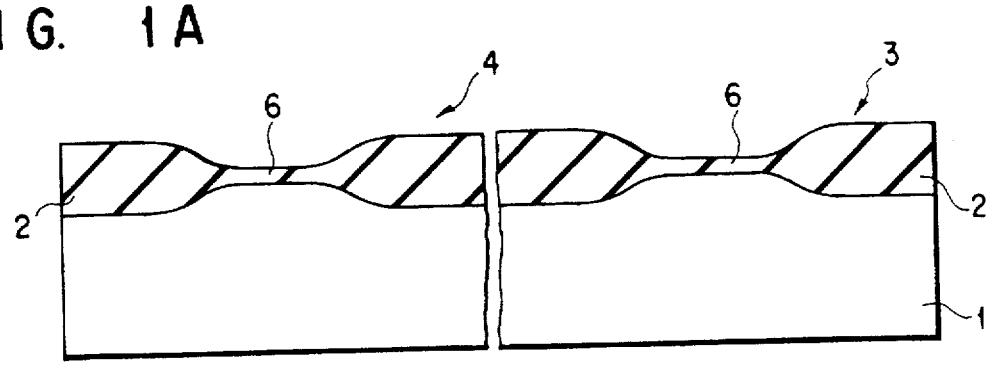
F I G. 1B
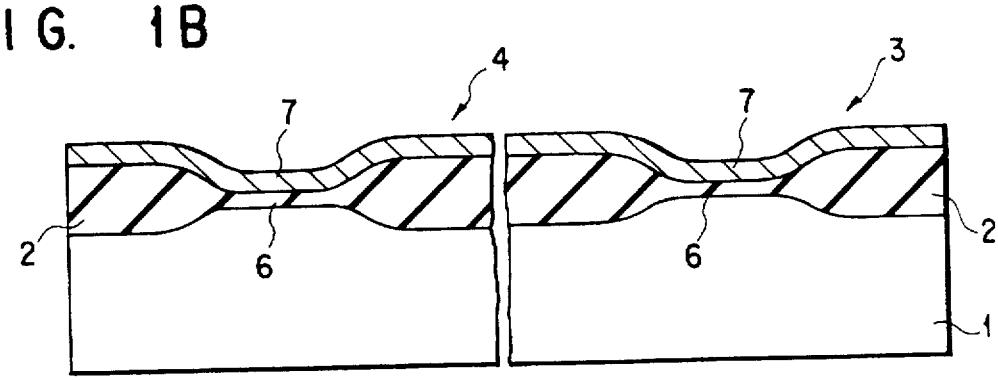
F I G. 1C
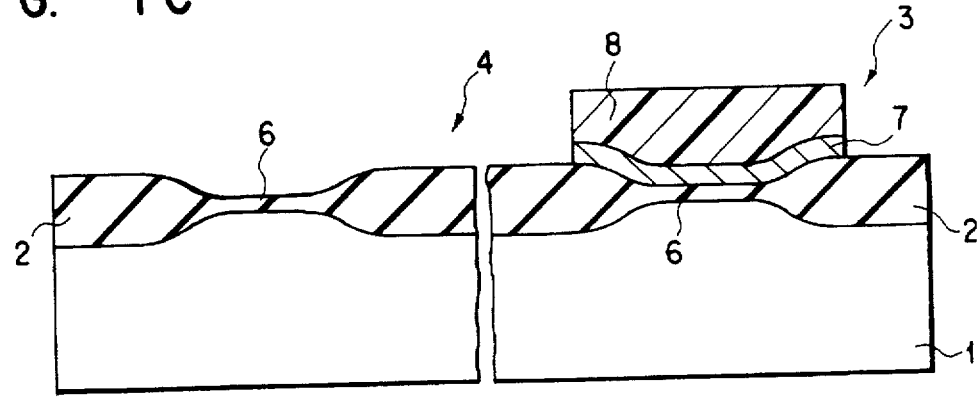
F I G. 1D

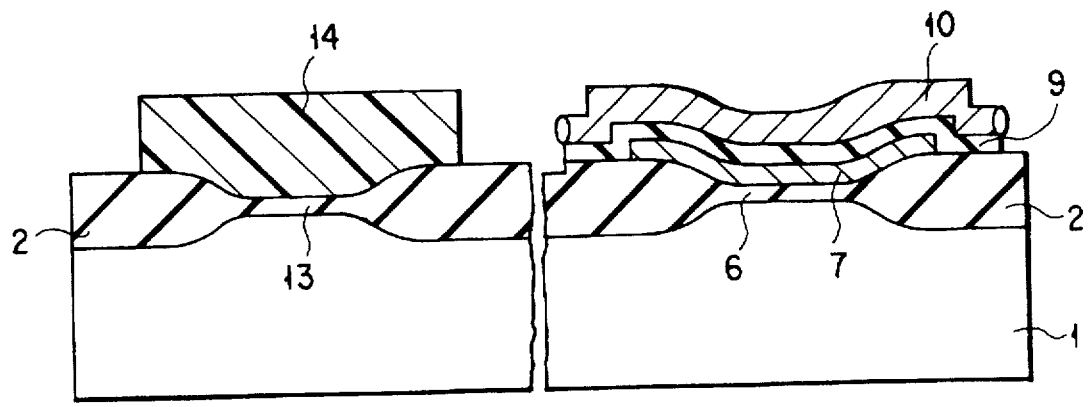
F I G. 1 I
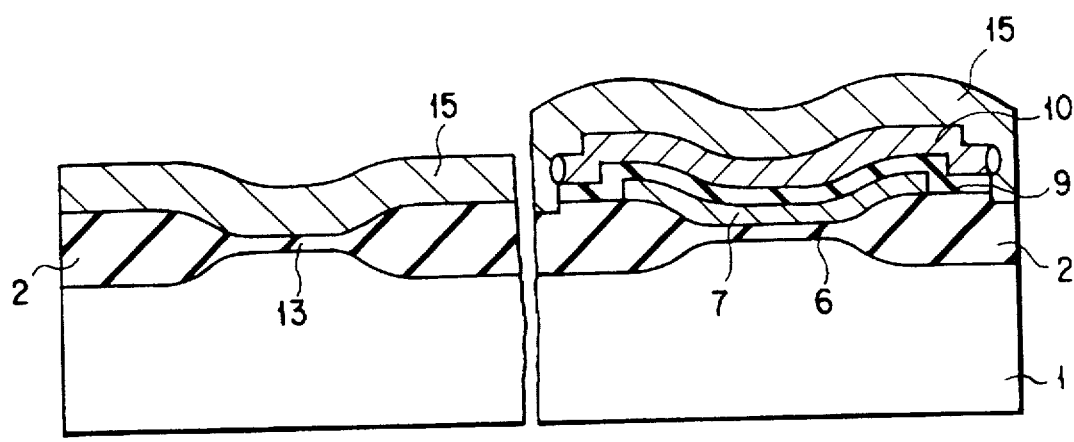
F I G. 1 J
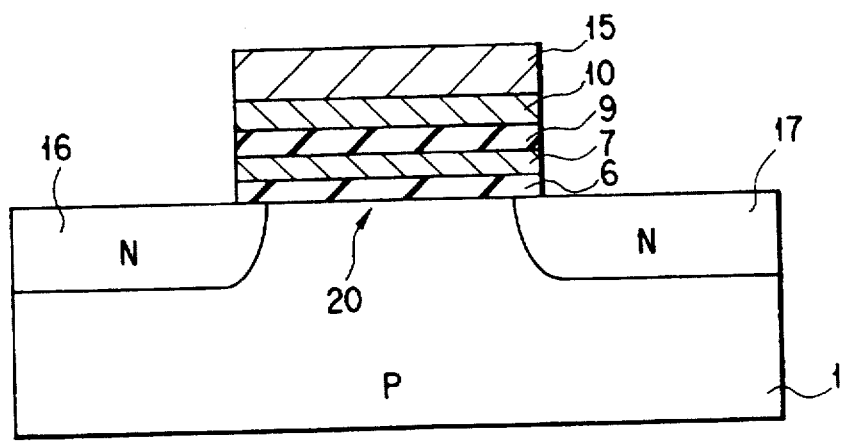
F I G. 2

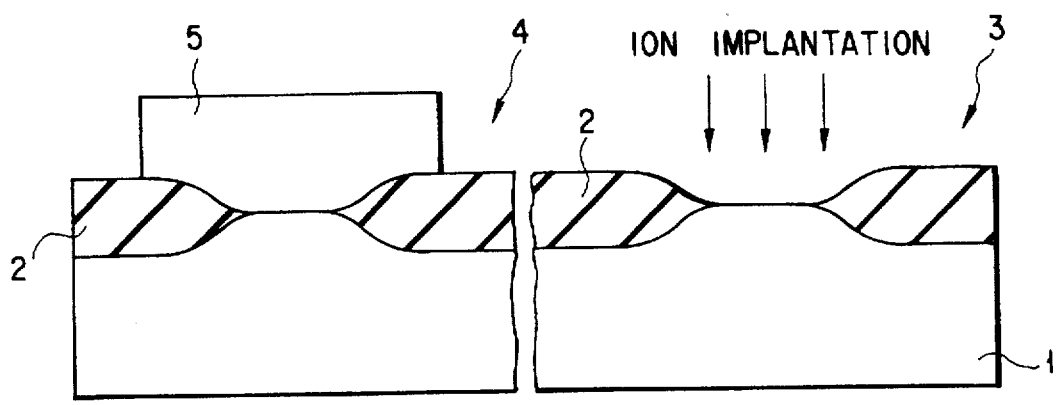
F I G. 3A
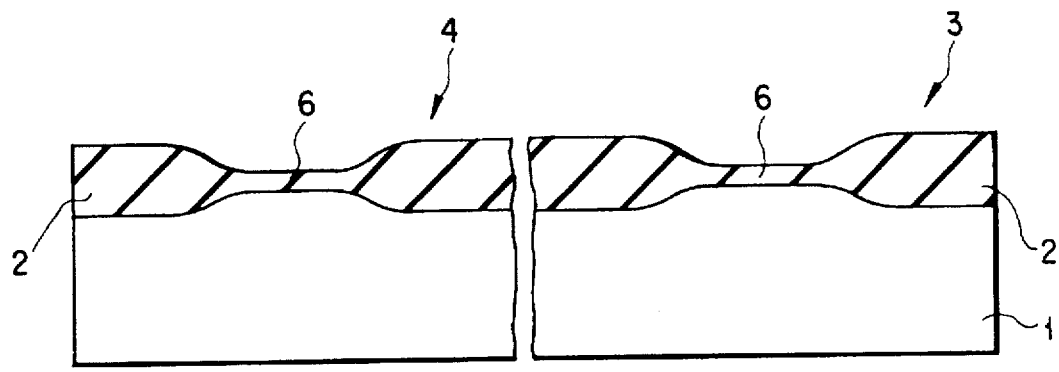
F I G. 3B
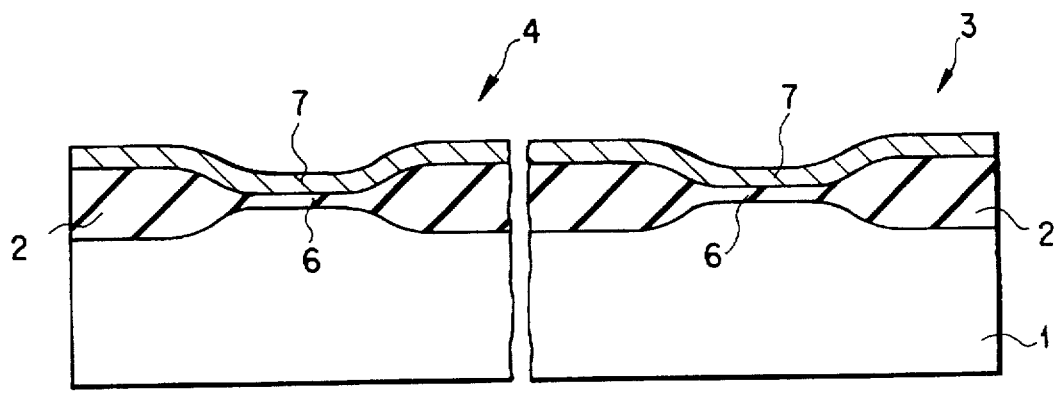
F I G. 3C

METHOD OF MANUFACTURING A NON-VOLATILE SEMICONDUCTOR MEMORY DEVICE WITH PERIPHERAL TRANSISTOR

This is a Continuation-in-Part of application Ser. No. 08/504,312, filed Jul. 20, 1995, now abandoned.

BACKGROUND OF THE INVENTION

1. Field of the Invention

The present invention relates to a method of manufacturing a non-volatile semiconductor memory device having a floating gate type non-volatile memory cell.

2. Description of the Related Art

An electrically programmable non-volatile semiconductor memory device called an EEPROM (Electrically Erasable Programmable Read-Only Memory) comprises a memory cell constituted by a MOS transistor having a two-layer gate electrode in which a floating gate and a control gate are formed with an insulating film interposed therebetween, and a peripheral transistor.

The non-volatile semiconductor memory device having the above structure can be manufactured, for example, by a method disclosed in U.S. Pat. No. 4,142,926.

At first, selected ions are implanted in a memory cell forming region on a semiconductor substrate on an as-needed basis. Then, a first insulating film is formed on the entire surface of the substrate by thermal oxidation, and a conductive film used for a floating gate is formed on the first insulating film.

A second insulating film is formed on the conductive film, and a resist mask is formed on the memory cell portion. The first insulating film, the conductive film for the floating gate, and the second insulating film, which are formed in a peripheral region including the peripheral transistor, are etched away.

Alternatively, a resist mask is formed on the memory cell portion and the conductive film for the floating gate formed in the peripheral region including the peripheral transistor is removed. Then, a second insulating film is formed and a resist mask is formed once again on the memory cell portion. Thus, the first and second insulating films formed in the peripheral region including the peripheral transistor are etched away.

Thereafter, while the resist mask is left on the memory cell portion, ions are implanted for forming the peripheral transistor. The resist mask is removed and then a gate insulating film of the peripheral transistor is formed by thermal oxidation. Moreover, conductive films for the control gate of the memory cell and the gate of the peripheral transistor are formed in the memory cell region and peripheral transistor region.

At last, a source and a drain are formed in the memory cell region and peripheral transistor region. Thus, a non-volatile semiconductor memory device having the memory cell and peripheral transistor is manufactured.

In the prior art, as described above, after the second insulating film is formed between the floating gate and the control gate, the second insulating film in the peripheral region excluding the memory cell region is removed and then the control gate is formed. Consequently, the following problem arises.

Until the control gate is formed after the formation of the second insulating film, the manufacturing process has to be carried out with the second insulating film being exposed. As a result, particles adhere to the second insulating film and insulation may be broken. Furthermore, when the peripheral region is washed by using a detergent which may denature or corrode the second insulating film, the memory cell region where the second insulating film is exposed needs to be covered with a resist and the washing efficiency deteriorates due to the resist.

SUMMARY OF THE INVENTION

The object of the present invention is to provide a method of manufacturing a non-volatile semiconductor memory device having a floating gate and a control gate, without a problem due to exposure of an insulating film between the floating gate and the control gate.

According to an aspect of the present invention, there is provided a method of manufacturing a non-volatile semiconductor memory device in which a non-volatile memory cell and a peripheral transistor are formed on a semiconductor substrate, the method comprising the steps of:

forming a first insulating film for the formation of a gate insulating film on at least a memory cell forming region of the semiconductor substrate having the memory cell forming region and a peripheral transistor forming region;

forming a first conductive film for the formation of a floating gate on the first insulating film;

forming a second insulating film on the first conductive film;

forming a second conductive film on the second insulating film for protecting the second insulating film;

subjecting the peripheral transistor forming region to a predetermined process; and forming a third conductive film, which will become a control gate of the memory cell and a gate of the peripheral transistor, on the second conductive film and the peripheral transistor forming region subjected to the predetermined process.

In this method, the peripheral transistor forming region is subjected to a predetermined process after the second conductive film for protection is formed on the second insulating film. Thus, the second insulating film is not exposed until the third conductive film for the control gate is formed. Accordingly, insulation breakage of the second insulating film due to adhesion of particles is prevented. Moreover, a mask is not needed at the time of washing the peripheral region. Besides, if the third conductive film for the control gate is formed on the second conductive film, the second conductive film and third conductive film cooperate as control gate. Therefore, a non-volatile semiconductor memory device can be manufactured without adding complex steps.

According to another aspect of the present invention, there is provided a method of manufacturing a non-volatile semiconductor memory device in which a non-volatile memory cell and a peripheral transistor are formed on a semiconductor substrate, the method comprising the steps of:

forming a first insulating film for the formation of a gate insulating film on at least a memory cell forming region of the semiconductor substrate having the memory cell forming region and a peripheral transistor forming region;

forming a first conductive film for the formation of a floating gate on the first insulating film;

forming a second insulating film on the first conductive film;

forming a second conductive film on the second insulating film for protecting the second insulating film;

forming an oxidation-resistant film on the second conductive film;

subjecting the peripheral transistor forming region to a predetermined process;

removing the oxidation-resistant film; and forming a third conductive film, which will become a control gate of the memory cell and a gate of the peripheral transistor, on the second conductive film and the peripheral transistor forming region subjected to the predetermined process.

According to this method, the peripheral transistor forming region is subjected to a predetermined process after the second conductive film for protection is formed on the second insulating film and the oxidation-resistant film is formed. Thus, even if the process for the peripheral transistor forming region includes, for example, thermal treatment, oxidation of the second conductive film can be prevented. Since the third conductive film for the control gate is formed after removing the oxidation-resistant film, the third conductive film and the second conductive film cooperate as control gate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

According to another aspect of the present invention, there is provided a method of manufacturing a non-volatile semiconductor memory device in which a non-volatile memory cell and a peripheral transistor are formed on a semiconductor substrate, the method comprising the steps of:

forming a first insulating film for the formation of a gate insulating film on at least a memory cell forming region of the semiconductor substrate having the memory cell forming region and a peripheral transistor forming region;

forming a first conductive film for the formation of a floating gate on the first insulating film;

forming a second insulating film on the first conductive film;

forming a second conductive film on the second insulating film for protecting the second insulating film;

subjecting the peripheral transistor forming region to a predetermined process;

removing an insulating film formed on the second conductive film in the step of subjecting the peripheral transistor forming region to a predetermined process; and forming a third conductive film, which will become a control gate of the memory cell and a gate of the peripheral transistor, on the second conductive film and the peripheral transistor forming region subjected to the predetermined process.

In this method, an insulating film such as an oxide film formed in the step of subjecting the peripheral transistor forming region to a predetermined process is removed before the step of forming a third conductive film, with the result that an electrical conductivity is improved between the second and third conductive films.

According to another aspect of the present invention, there is provided a method of manufacturing a non-volatile semiconductor memory device in which a non-volatile memory cell and a peripheral transistor are formed on a semiconductor substrate, the method comprising the steps of:

forming a first insulating film for the formation of a gate insulating film on at least a memory cell forming region of the semiconductor substrate having the memory cell forming region and a peripheral transistor forming region;

forming a first conductive film for the formation of a floating gate on the first insulating film;

forming a second insulating film on the first conductive film;

forming a second conductive film on the second insulating film for protecting the second insulating film;

forming a washing-resistant film on the second conductive film;

subjecting the peripheral transistor forming region to a predetermined process;

removing the washing-resistant film; and forming a third conductive film, which will become a control gate of the memory cell and a gate of the peripheral transistor, on the second conductive film and the peripheral transistor forming region subjected to the predetermined process.

In this method, the second conductive film for protection is formed on the second insulating film, followed by forming a washing-resistant film. Then, a predetermined process is applied to the peripheral transistor forming region. Naturally, the second conductive film is prevented from being damaged in the washing step included in the predetermined process. Further, since a third conductive film for the control gate is formed after removal of the washing-resistant film, the third conductive film and the second conductive film are integrated to function as a control gate.

According to still another aspect of the present invention, there is provided a method of manufacturing a non-volatile semiconductor memory device in which a non-volatile memory cell and a peripheral transistor are formed on a semiconductor substrate, the method comprising the steps of:

forming a first insulating film for the formation of a gate insulating film on at least a memory cell forming region of the semiconductor substrate having the memory cell forming region and a peripheral transistor forming region;

forming a first conductive film for the formation of a floating gate on the first insulating film;

forming a second insulating film on the first conductive film;

forming a second conductive film on the second insulating film for protecting the second insulating film;

forming an etching-resistant film on the second conductive film;

subjecting the peripheral transistor forming region to a predetermined process;

removing the etching-resistant film; and forming a third conductive film, which will become a control gate of the memory cell and a gate of the peripheral transistor, on the second conductive film and the peripheral transistor forming region subjected to the predetermined process.

In this method, the second conductive film for protection is formed on the second insulating film, followed by forming an etching-resistant film. Then, a predetermined process is applied to the peripheral transistor forming region. Naturally, the second conductive film is prevented from being damaged in the etching step included in the predetermined process. Further, since a third conductive film for the control gate is formed after removal of the etching-resistant film, the third conductive film and the second conductive film collectively act as a control gate.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 1A to 1J are cross-sectional views illustrating a method of manufacturing a non-volatile semiconductor memory device according to an embodiment of the present invention;

FIG. 2 is a cross-sectional view of a memory cell of the non-volatile semiconductor memory device manufactured by the steps illustrated in FIGS. 1A to 1J; and FIGS. 3A to 3I are cross-sectional views illustrating a method of manufacturing a non-volatile semiconductor memory device according to another embodiment of the present invention.

DETAILED DESCRIPTION OF THE PREFERRED EMBODIMENTS

Figure 1E:
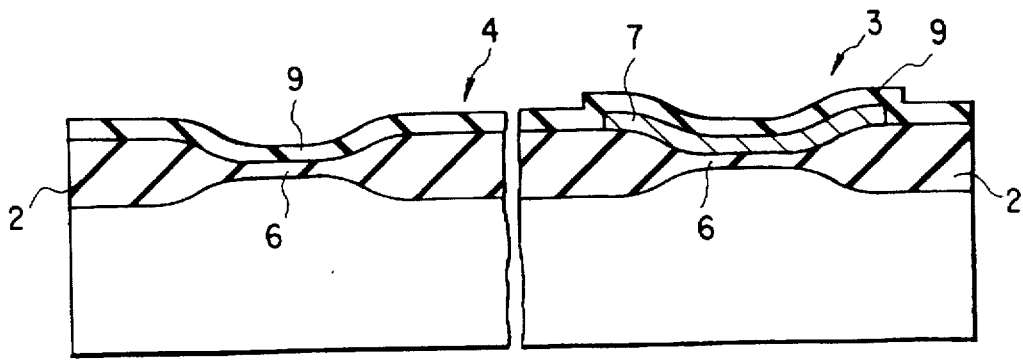

Preferred embodiments of the present invention will now be described.

FIGS. 1A to 1J are cross-sectional views illustrating a method of manufacturing a non-volatile semiconductor memory device according to an embodiment of the present invention.

In FIG. 1A, a field oxide film 2 is formed by selective oxidation as an element separation region on a P-type silicon substrate 1 serving as a semiconductor substrate. Thus, the substrate is separated into a memory cell forming region 3 and a peripheral transistor forming region 4. A resist mask 5 is formed on the peripheral transistor forming region 4 and boron (B) ions are implanted as dopant in the memory cell forming region 3 at an acceleration voltage of 30 KeV in a dosage of $1 \times 10^{12}$.

In FIG. 1B, a gate insulating film 6 for the formation of the memory cell is formed on the entire surface of the silicon substrate 1 by thermal oxidation to a thickness of 100 Å (angstrom). Subsequently, as shown in FIG. 1C, a first conductive film 7 of a polysilicon for the formation of a floating gate is formed by CVD on the insulating film 6 to a thickness of 1000 Å.

Then, a resist mask 8 is formed on a gate forming portion of the memory cell forming region 3, as shown in FIG. 1D, and that part of the first conductive film 7, excluding the gate forming portion, is removed by dry etching. Thus, a floating gate is formed. In FIG. 1E, an insulating film 9 is formed by CVD on the entire surface of the resultant structure as an insulating film between the floating gate and a control gate. The insulating film 9 is an ONO film in which an $Si_3N_4$ film is sandwiched by two $SiO_2$ films, each film being 100 Å thick.

Figure 1F:
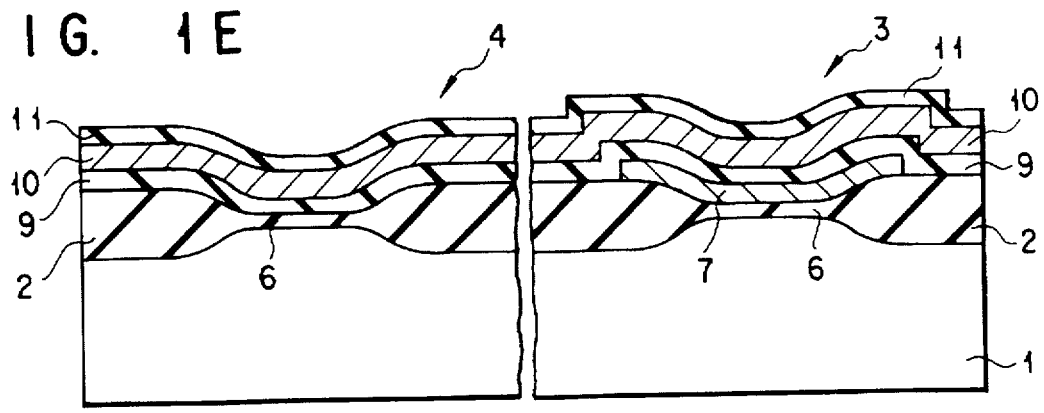

In FIG. 1F, a second conductive film 10 of a polysilicon for protecting the insulating film is formed by CVD on the insulating film 9 to a thickness of 1000 Å. An protection film 11 of $Si_3N_4$ is formed by CVD on the resultant structure to a thickness of 100 Å.

The protection film 11 performs the function of an oxidation-resistant film for preventing the second conductive film from 10 being oxidized in the subsequent step of forming the gate insulating film 13 in the peripheral transistor forming region 4, the function of a washing-resistant film for preventing the second conductive film 10 from being damaged in the washing step accompanying the treatment applied to the peripheral transistor forming region, and the function of an etching-resistant film for preventing the second conductive film 10 from being damaged in the etching step for removing the insulating film in the peripheral region.

Figure 1G:
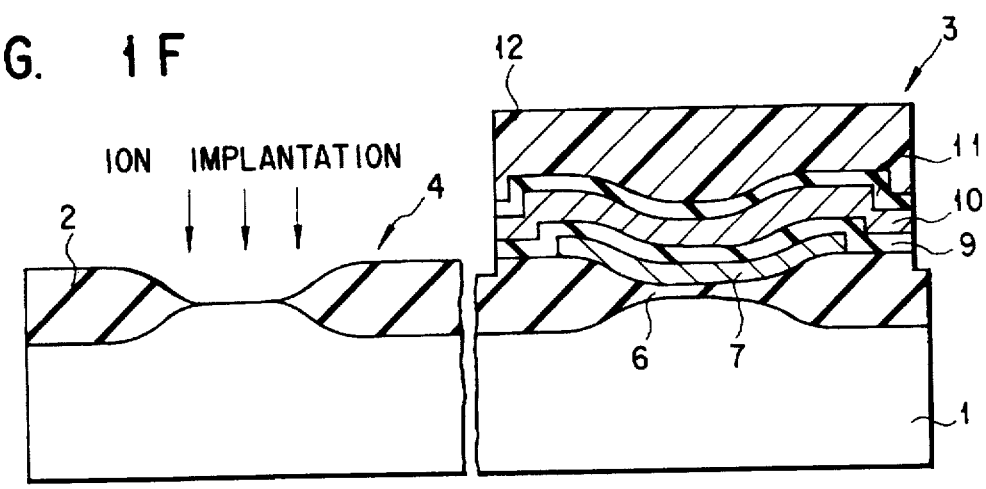

Thereafter, as shown in FIG. 1G, a resist mask 12 is formed on the memory cell forming region 3, and the oxidation-resistant protection film 11, second conductive film 10, insulating film 9 and insulating film 6 on the peripheral region are removed by dry etching. Boron (B) ions are implanted as dopant in the peripheral transistor forming region 4 at an acceleration voltage of 30 KeV in a dosage of $5 \times 10^{12}$.

Figure 1H:
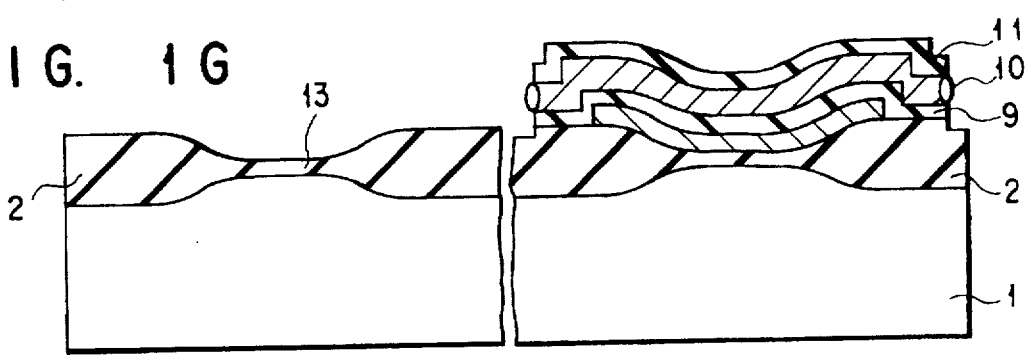

In FIG. 1H, a gate insulating film 13 for the peripheral transistor is formed by thermal oxidation. In FIG. 1I, a resist mask 14 is formed on the gate forming portion of the peripheral transistor forming region 4, and the oxidation-resistant protection film 11 of the memory cell forming region 3 is removed by dry etching.

In FIG. 1J, a third conductive film 15, which will become a control gate of the memory cell and a gate of the peripheral transistor, is formed in the memory cell forming region 3 and peripheral transistor forming region 4.

Finally, the unnecessary portion of the film is removed and sources and drains of the memory cell and peripheral transistor are formed. Thus, a non-volatile semiconductor memory device is formed.

In the above manufacturing method, the second conductive film 10 for protection is formed on the insulating film 9 which is used as an insulating film between the floating gate and the control gate. Thus, when ions are implanted in the peripheral transistor region 4 or the gate insulating film 13 is formed, the insulating film 9 is not exposed and insulation breakage of the insulating film 9 due to adhesion of particles is prevented. Moreover, a mask is not needed at the time of washing the peripheral region. Besides, even in the case where the second conductive film 10 for protection is formed, if the third conductive film 15 for the control gate is formed on the second conductive film 10, the second conductive film 10 and third conductive film 15 cooperate as control gate. Therefore, complex steps are not needed.

Furthermore, since the protection film 11 performing the functions of an oxidation-resistant film, a washing-resistant film and an etching-resistant film is formed on the second conductive film 10 for protection, the second conductive film 10 is prevented from being oxidized in the thermal oxidation step and CVD step for forming the gate insulating film 13 in the peripheral transistor forming region 4. The second conductive film 10 is also prevented from damages such as change of properties and corrosion during the washing and etching treatments accompanying the method of manufacturing a semiconductor device.

The memory cell of the thus manufactured non-volatile semiconductor memory device has a structure as shown in FIG. 2. Specifically, an N-type source 16 and an N-type drain 17 are formed in a major surface of the substrate 1. A gate insulating film 6, a floating gate 7, an interlayer insulation film 9, a protection conductive film 10 and a control gate 15 are successively formed on a channel region 20 between the source 16 and drain 17. As described above, the protective conductive film 10 is integrated with the control gate 15 and functions as a part of the control gate.

Another embodiment of the present invention will now be described.

FIGS. 3A to 3I are cross-sectional views illustrating a method of manufacturing a non-volatile semiconductor memory device according to this embodiment of the present invention.

The steps in FIGS. 3A to 3C, through which the conductive film 7 of polysilicon for the floating gate is formed, are carried out under the same conditions and in the same manner as steps 1A to 1C in the preceding embodiment.

Figure 3D:
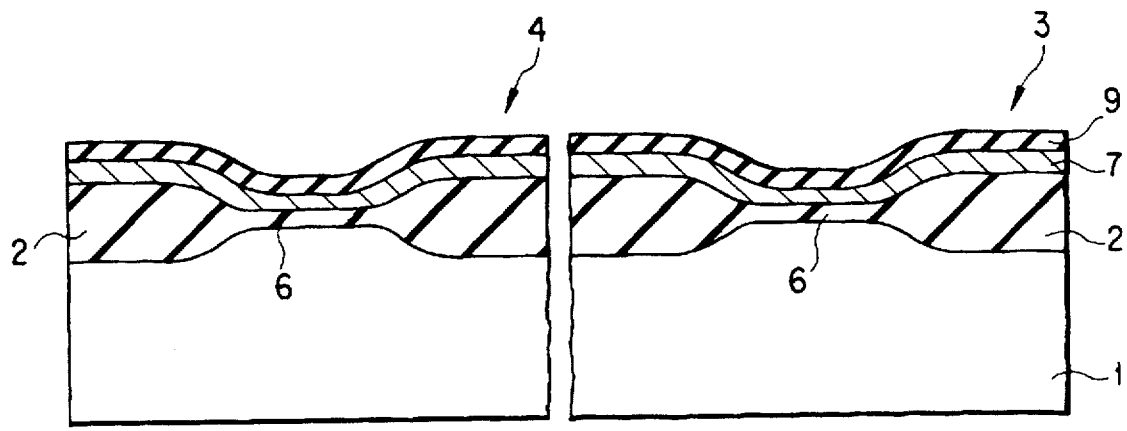

As shown in FIG. 3D, an insulating film 9 is formed by CVD on the first conductive film 7 as an insulating film between a floating gate and a control gate. Like the preceding embodiment, the insulating film 9 is an ONO film in which an $Si_3N_4$ film is sandwiched by two $SiO_2$ films, each film being 100 Å thick.

Figure 3E:
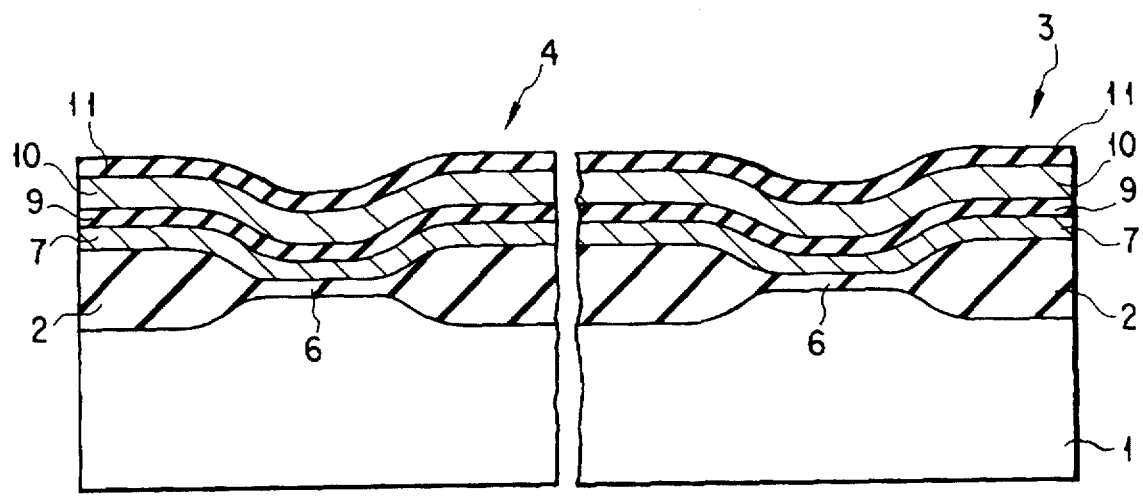

In FIG. 3E, a second conductive film 10 of a polysilicon for protecting the insulating film is formed by CVD on the insulating film 9 to a thickness of 1000 Å. An oxidation-resistant protection film 11 of $Si_3N_4$ is formed by CVD on the resultant structure to a thickness of 100 Å.

Figure 3F:
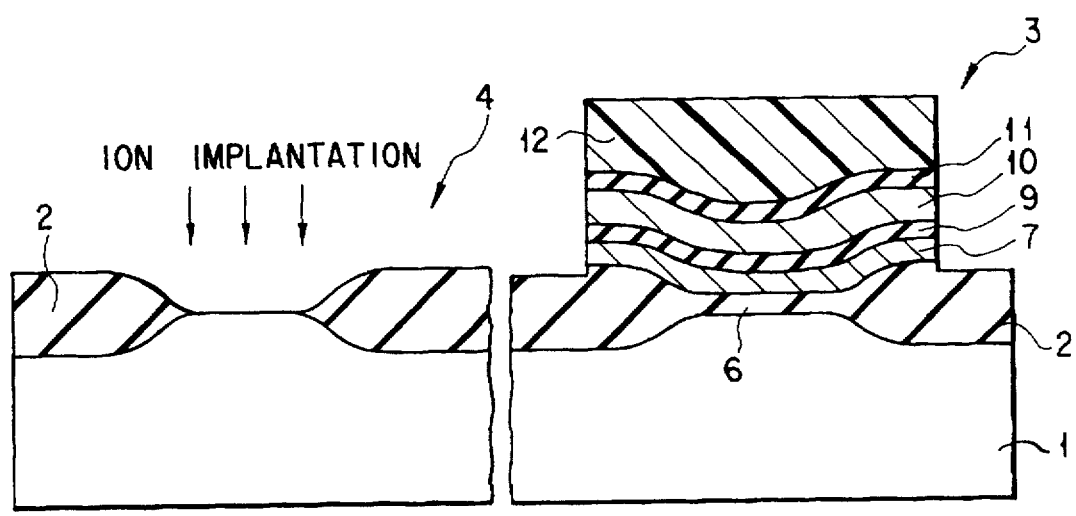

Thereafter, as shown in FIG. 3F, a resist mask 12 is formed on the memory cell forming region 3, and the oxidation-resistant protection film 11, second conductive film 10, insulating film 9, first conductive film 7 and insulating film 6 on the peripheral region are removed by dry etching. Boron (B) ions are implanted as dopant in the peripheral transistor forming region 4 at an acceleration voltage of 30 KeV in a dosage of $5 \times 10^{12}$.

Figure 3G:
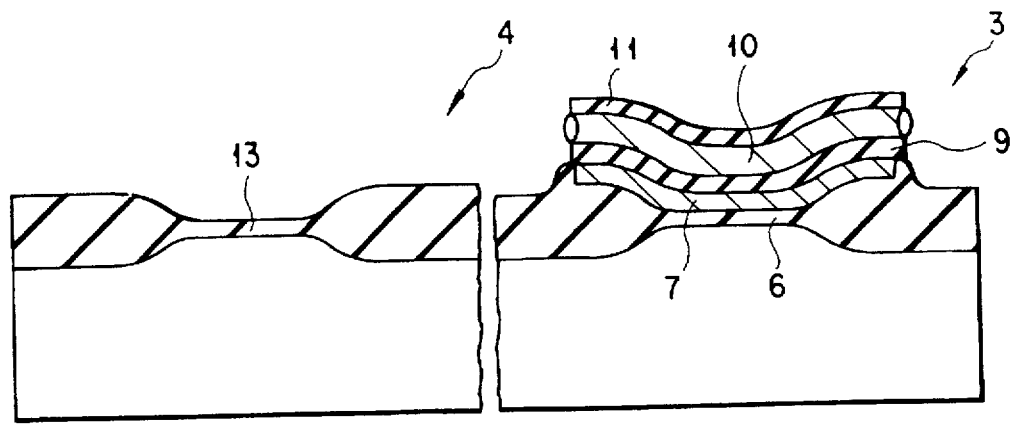
Figure 3H:
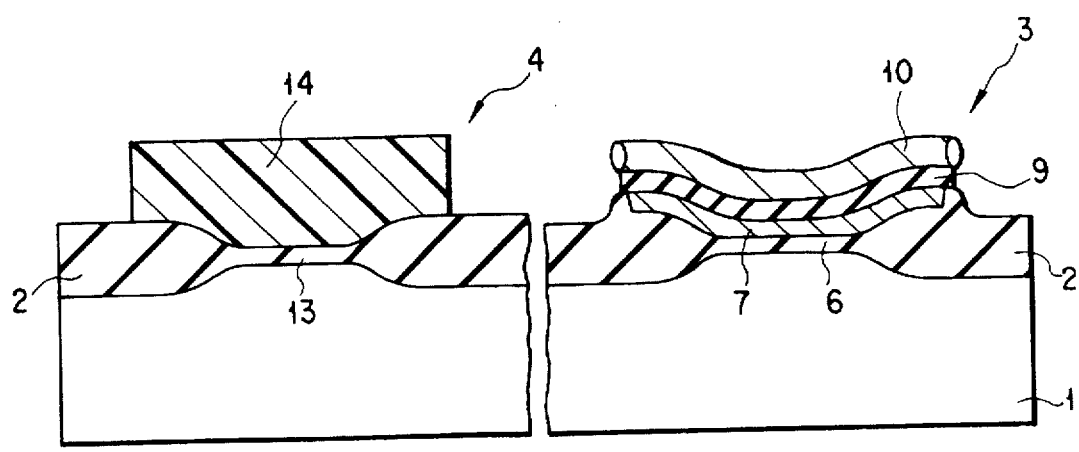

In FIG. 3G, a gate insulating film 13 for the peripheral transistor is formed by thermal oxidation. In FIG. 3H, a resist mask 14 is formed on the gate forming portion of the peripheral transistor forming region 4, and the oxidation-resistant protection film 11 of the memory cell forming region 3 is removed by dry etching.

Figure 3I:
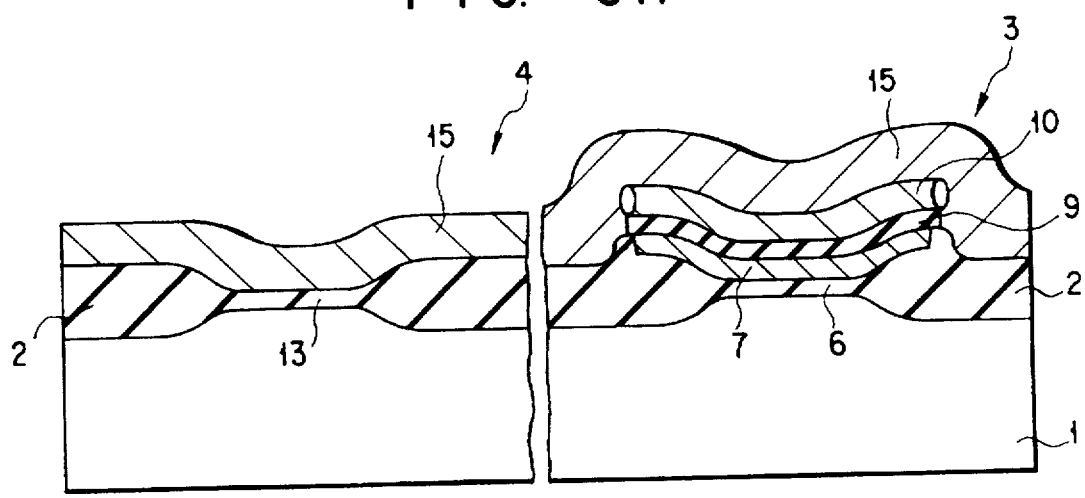

In FIG. 3I, a third conductive film 15, which will become a control gate of the memory cell and a gate of the peripheral transistor, is formed in the memory cell forming region 3 and peripheral transistor forming region 4.

Finally, the unnecessary portion of the film is removed and sources and drains of the memory cell and peripheral transistor are formed. Thus, a non-volatile semiconductor memory device is formed. In this embodiment, as compared to the preceding embodiment, the manufacturing steps are simplified.

The memory cell of the thus manufactured non-volatile semiconductor memory device has the same structure as shown in FIG. 2, which has been described above.

The present invention is not limited to the above embodiments, and various modifications can be made. For example, the P-type silicon substrate may be replaced with an N-type substrate, and the material of the substrate is not limited to silicon. Various types of insulating films may be used, and the method for forming the gate insulating film is not limited to thermal oxidation. The protection film 11 is not absolutely necessary. As described previously, the protection film 11 performs the function of an oxidation-resistant film. Therefore, the second conductive film is protected from oxidation, in the case of forming the protection film 11. Where the protection film 11 is not formed, however, it is unavoidable for traces of an insulating film consisting of oxides etc. to be formed on the second conductive film in the step of forming a gate insulating film in the peripheral transistor forming region, whether a thermal oxidation or CVD method may be employed for forming the gate insulating film. Therefore, in the case of not forming the protection film 11, it is desirable to remove an insulating from formed on the second conductor film before formation of the third conductive film in order to ensure a high electrical conductivity between the second and third conductive films. The polysilicon conductive films may be replaced with, for example, silicide conductive films. Furthermore, the thickness of each film may be freely chosen according to required characteristics.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a non-volatile semiconductor memory device in which a non-volatile memory cell and a peripheral transistor are formed on a semiconductor substrate, the method comprising the steps of:

forming a first insulating film for the formation of a gate insulating film on at least a memory cell forming region of the semiconductor substrate having the memory cell forming region and a peripheral transistor forming region;

forming a first conductive film for the formation of a floating gate on said first insulating film;

forming a second insulating film on said first conductive film;

forming a second conductive film on the second insulating film for protecting the second insulating film;

subjecting said peripheral transistor forming region to a first process; and forming a third conductive film, which will become a control gate of the memory cell and a gate of the peripheral transistor, on the second conductive film and the peripheral transistor forming region subjected to said first process.

2. The method of manufacturing a non-volatile semiconductor memory device according to claim 1, wherein said second conductive film and said third conductive film are integrated to function as a control gate.

3. The method of manufacturing a non-volatile semiconductor memory device according to claim 1, wherein said first, second and third conductive films are formed of polysilicon.

4. The method of manufacturing a non-volatile semiconductor memory device according to claim 1, wherein said second insulating film has a three-layer structure in which an $Si_3N_4$ film is sandwiched by two $SiO_2$ films.

5. A method of manufacturing a non-volatile semiconductor memory device in which a non-volatile memory cell and a peripheral transistor are formed on a semiconductor substrate, the method comprising the steps of:

forming a first insulating film for the formation of a gate insulating film on at least a memory cell forming region of the semiconductor substrate having the memory cell forming region and a peripheral transistor forming region;

forming a first insulating film for the formation of a gate insulating film on at least a memory cell forming region of the semiconductor substrate having the memory cell forming region and a peripheral transistor forming region;

forming a first conductive film for the formation of a floating gate on said first insulating film;

forming a second insulating film on said first conductive film;

forming a second conductive film on the second insulating film for protecting the second insulating film;

forming an oxidation-resistant film on said second conductive film;

subjecting said peripheral transistor forming region to a first process;

removing said oxidation-resistant film; and forming a third conductive film, which will become a control gate of the memory cell and a gate of the peripheral transistor, on the second conductive film and the peripheral transistor forming region subjected to said first process.

6. The method of manufacturing a non-volatile semiconductor memory device according to claim 5, wherein said second conductive film and said third conductive film are integrated to function as a control gate.

7. The method of manufacturing a non-volatile semiconductor memory device according to claim 5, wherein said first, second and third conductive films are formed of polysilicon.

8. The method of manufacturing a non-volatile semiconductor memory device according to claim 5, wherein said second insulating film has a three-layer structure in which an $Si_3N_4$ film is sandwiched by two $SiO_2$ films.

9. The method of manufacturing a non-volatile semiconductor memory device according to claim 5, wherein said oxidation-resistant film is formed of $Si_3N_4$.

10. A method of manufacturing a non-volatile semiconductor memory device, said method comprising the steps of:

separating a semiconductor substrate into a memory cell forming region and a peripheral transistor forming region;

forming a mask on the peripheral transistor forming region and implanting a dopant in the memory cell forming region;

forming a first insulating film on the entire surface of the substrate;

forming a first conductive film for the formation of a floating gate on the first insulating film in the memory cell forming region;

forming a second insulating film on the entire surface of the resultant structure;

forming a second conductive film on the second insulating film for protecting the second insulating film;

forming an oxidation-resistant film on said second conductive film;

removing the oxidation-resistant film, the second conductive film and the first and second insulating films in the peripheral transistor forming region;

forming a mask on the memory cell forming region and injecting a dopant in the peripheral transistor forming region;

forming a gate insulating film for the peripheral transistor on the peripheral transistor forming region by thermal oxidation;

removing the oxidation-resistant film in the memory cell forming region; and forming a third conductive film, which will become a control gate of the memory cell and a gate of the peripheral transistor, on the second conductive film and the peripheral transistor forming region.

11. The method of manufacturing a non-volatile semiconductor memory device according to claim 10, wherein said second conductive film and said third conductive film are integrated to function as a control gate.

12. The method of manufacturing a non-volatile semiconductor memory device according to claim 10, wherein said first, second and third conductive films are formed of polysilicon.

13. The method of manufacturing a non-volatile semiconductor memory device according to claim 10, wherein said second insulating film has a three-layer structure in which an $Si_3N_4$ film is sandwiched by two $SiO_2$ films.

14. The method of manufacturing a non-volatile semiconductor memory device according to claim 10, wherein said oxidation-resistant film is formed of $Si_3N_4$.

15. A method of manufacturing a non-volatile semiconductor memory device, said method comprising the steps of:

separating a semiconductor substrate into a memory cell forming region and a peripheral transistor forming region;

forming a mask on the peripheral transistor forming region and implanting a dopant in the memory cell forming region;

forming a first insulating film on the entire surface of the substrate;

forming a first conductive film for a floating gate on the first insulating film;

forming a second insulating film on the first conductive film;

forming a second conductive film on the second insulating film for protecting the second insulating film;

forming an oxidation-resistant film on said second conductive film;

removing the oxidation-resistant film, the first and second conductive films and the first and second insulating films in the peripheral transistor forming region;

forming a mask on the memory cell forming region and injecting a dopant in the peripheral transistor forming region;

forming a gate insulating film for the peripheral transistor on the peripheral transistor forming region by thermal oxidation;

removing the oxidation-resistant film in the memory cell forming region; and forming a third conductive film, which will become a control gate of the memory cell and a gate of the peripheral transistor, on the second conductive film and the peripheral transistor forming region.

16. The method of manufacturing a non-volatile semiconductor memory device according to claim 15, wherein said second conductive film and said third conductive film are integrated to function as a control gate.

17. The method of manufacturing a non-volatile semiconductor memory device according to claim 15, wherein said first, second and third conductive films are formed of polysilicon.

18. The method of manufacturing a non-volatile semiconductor memory device according to claim 15, wherein said second insulating film has a three-layer structure in which an $Si_3N_4$ film is sandwiched by two $SiO_2$ films.

19. The method of manufacturing a non-volatile semiconductor memory device according to claim 15, wherein said oxidation-resistant film is formed of $Si_3N_4$.

20. A method of manufacturing a non-volatile semiconductor memory device in which a non-volatile memory cell and a peripheral transistor are formed on a semiconductor substrate, the method comprising the steps of:

forming a first insulating film for the formation of a gate insulating film on at least a memory cell forming region of the semiconductor substrate having the memory cell forming region and a peripheral transistor forming region;

forming a first conductive film for the formation of a floating gate on the first insulating film;

forming a second insulating film on the first conductive film;

forming a second conductive film on the second insulating film for protecting the second insulating film;

subjecting the peripheral transistor forming region to a first process;

removing an insulating film formed on the second conductive film in the step of subjecting the peripheral transistor forming region to a first process; and forming a third conductive film, which will become a control gate of the memory cell and a gate of the peripheral transistor, on the second conductive film and the peripheral transistor forming region subjected to the first process.

21. The method of manufacturing a non-volatile semiconductor memory device according to claim 20, wherein said second conductive film and said third conductive film are integrated to function as a control gate.

22. The method of manufacturing a non-volatile semiconductor memory device according to claim 20, wherein each of said first, second and third conductive films is formed of polysilicon.

23. The method of manufacturing a non-volatile semiconductor memory device according to claim 20, wherein said second insulating film is of a three-layer structure including a central $Si_3N_4$ film and two $SiO_2$ films having said $Si_3N_4$ film interposed therebetween.

24. A method of manufacturing a non-volatile semiconductor memory device in which a non-volatile memory cell and a peripheral transistor are formed on a semiconductor substrate, the method comprising the steps of:

forming a first insulating film for the formation of a gate insulating film on at least a memory cell forming region of the semiconductor substrate having the memory cell forming region and a peripheral transistor forming region;

forming a first conductive film for the formation of a floating gate on the first insulating film;

forming a second insulating film on the first conductive film;

forming a second conductive film on the second insulating film for protecting the second insulating film;

forming a washing-resistant film on the second conductive film;

subjecting the peripheral transistor forming region to a first process;

removing the washing-resistant film; and forming a third conductive film, which will become a control gate of the memory cell and a gate of the peripheral transistor, on the second conductive film and the peripheral transistor forming region subjected to the first process.

25. The method of manufacturing a non-volatile semiconductor memory device according to claim 24, wherein said second conductive film and said third conductive film are integrated to function as a control gate.

26. The method of manufacturing a non-volatile semiconductor memory device according to claim 24, wherein each of said first, second and third conductive films is formed of polysilicon.

27. The method of manufacturing a non-volatile semiconductor memory device according to claim 24, wherein said second insulating film is of a three-layer structure including a central $Si_3N_4$ film and two $SiO_2$ films having said $Si_3N_4$ film interposed therebetween.

28. The method of manufacturing a non-volatile semiconductor memory device according to claim 24, wherein said washing-resistant film is made of $Si_3N_4$.

29. A method of manufacturing a non-volatile semiconductor memory device, comprising the steps of:

separating a semiconductor substrate into a memory cell forming region and a peripheral transistor forming region;

injecting a dopant into said memory cell forming region, with a mask applied to said peripheral transistor forming region;

forming a first insulating film on the entire surface of said substrate;

forming a first conductive film for the formation of a floating gate on that region of said first insulating film which is positioned on the memory cell forming region;

forming a second insulating film on the entire surface;

forming a second conductive film for protection on said second insulating film;

forming a washing-resistant film on said second conductive film;

removing those regions of said washing-resistant film, second conductive film, first and second insulating films which are formed in said peripheral transistor region;

injecting a dopant into said peripheral transistor forming region, with a mask applied to said memory cell forming region;

forming a gate insulating film for said peripheral transistor by thermal oxidation in the peripheral transistor forming region;

removing said washing-resistant film from the memory cell forming region; and forming a third conductive film, which will become a control gate of the memory cell and a gate of the peripheral transistor, on the second conductive film and the peripheral transistor forming region.

30. The method of manufacturing a non-volatile semiconductor memory device according to claim 29, wherein said second conductive film and said third conductive film are integrated to function as a control gate.

31. The method of manufacturing a non-volatile semiconductor memory device according to claim 29, wherein each of said first, second and third conductive films is formed of polysillcon.

32. The method of manufacturing a non-volatile semiconductor memory device according to claim 29, wherein said second insulating film is of a three-layer structure including a central $Si_3N_4$ film and two $SiO_2$ films having said $Si_3N_4$ film interposed therebetween.

33. The method of manufacturing a non-volatile semiconductor memory device according to claim 29, wherein said washing-resistant film is made of $Si_3N_4$.

34. A method of manufacturing a non-volatile semiconductor memory device, comprising the steps of:

separating a semiconductor substrate into a memory cell forming region and a peripheral transistor forming region;

injecting a dopant into said memory cell forming region, with a mask applied to said peripheral transistor forming region;

forming a first insulating film on the entire surface of said substrate;

forming a first conductive film for the formation of a floating gate on said first insulating film;

forming a second insulating film on said first conductive film;

forming a second conductive film for protection on said second insulating film;

forming a washing-resistant film on said second conductive film;

removing those regions of said washing-resistant film, first and second conductive films, and first and second insulating films which are formed in said peripheral transistor region;

injecting a dopant into said peripheral transistor forming region, with a mask applied to said memory cell forming region;

forming a gate insulating film for said peripheral transistor by thermal oxidation in the peripheral transistor forming region;

removing said washing-resistant film from the memory cell forming region; and forming a third conductive film, which will become a control gate of the memory cell and a gate of the peripheral transistor, on the second conductive film and the peripheral transistor forming region.

35. The method of manufacturing a non-volatile semiconductor memory device according to claim 34, wherein said second conductive film and said third conductive film are integrated to function as a control gate.

36. The method of manufacturing a non-volatile semiconductor memory device according to claim 34, wherein each of said first, second and third conductive films is formed of polysilicon.

37. The method of manufacturing a non-volatile semiconductor memory device according to claim 34, wherein said second insulating film is of a three-layer structure including a central $Si_3N_4$ film and two $SiO_2$ films having said $Si_3N_4$ film interposed therebetween.

38. The method of manufacturing a non-volatile semiconductor memory device according to claim 34, wherein said washing-resistant film is made of $Si_3N_4$.

39. A method of manufacturing a non-volatile semiconductor memory device in which a non-volatile memory cell and a peripheral transistor are formed on a semiconductor substrate, the method comprising the steps of:

forming a first insulating film for the formation of a gate insulating film on at least a memory cell forming region of the semiconductor substrate having the memory cell forming region and a peripheral transistor forming region;

forming a first conductive film for the formation of a floating gate on the first insulating film;

forming a second insulating film on the first conductive film;

forming a second conductive film on the second insulating film for protecting the second insulating film;

forming an etching-resistant film on the second conductive film;

subjecting the peripheral transistor forming region to a first process;

removing the washing-resistant film; and forming a third conductive film, which will become a control gate of the memory cell and a gate of the peripheral transistor, on the second conductive film and the peripheral transistor forming region subjected to the first process.

40. The method of manufacturing a non-volatile semiconductor memory device according to claim 39, wherein said second conductive film and said third conductive film are integrated to function as a control gate.

41. The method of manufacturing a non-volatile semiconductor memory device according to claim 39, wherein each of said first, second and third conductive films is formed of polysilicon.

42. The method of manufacturing a non-volatile semiconductor memory device according to claim 39, wherein said second insulating film is of a three-layer structure including a central $Si_3N_4$ film and two $SiO_2$ films having said $Si_3N_4$ film interposed therebetween.

43. The method of manufacturing a non-volatile semiconductor memory device according to claim 39, wherein said etching-resistant film is made of $Si_3N_4$.

44. A method of manufacturing a non-volatile semiconductor memory device, comprising the steps of:

separating a semiconductor substrate into a memory cell forming region and a peripheral transistor forming region;

injecting a dopant into said memory cell forming region, with a mask applied to said peripheral transistor forming region;

forming a first insulating film on the entire surface of said substrate;

forming a first conductive film for the formation of a floating gate on that region of said first insulating film which is positioned on the memory cell forming region;

forming a second insulating film on the entire surface;

forming a second conductive film for protection on said second insulating film;

forming an etching-resistant film on said second conductive film;

removing those regions of said etching-resistant film, second conductive film, first and second insulating films which are formed in said peripheral transistor region;

injecting a dopant into said peripheral transistor forming region, with a mask applied to said memory cell forming region;

forming a gate insulating film for said peripheral transistor by thermal oxidation in the peripheral transistor forming region;

removing said etching-resistant film from the memory cell forming region; and forming a third conductive film, which will become a control gate of the memory cell and a gate of the peripheral transistor, on the second conductive film and the peripheral transistor forming region.

45. The method of manufacturing a non-volatile semiconductor memory device according to claim 44, wherein said second conductive film and said third conductive film are integrated to function as a control gate.

46. The method of manufacturing a non-volatile semiconductor memory device according to claim 44, wherein each of said first, second and third conductive films is formed of polysilicon.

47. The method of manufacturing a non-volatile semiconductor memory device according to claim 44, wherein said second insulating film is of a three-layer structure including a central $Si_3N_4$ film and two $SiO_2$ films having said $Si_3N_4$ film interposed therebetween.

48. The method of manufacturing a non-volatile semiconductor memory device according to claim 44, wherein said washing-resistant film is made of $Si_3N_4$.

49. A method of manufacturing a non-volatile semiconductor memory device, comprising the steps of:

separating a semiconductor substrate into a memory cell forming region and a peripheral transistor forming region;

injecting a dopant into said memory cell forming region, with a mask applied to said peripheral transistor forming region;

forming a first insulating film on the entire surface of said substrate;

forming a first conductive film for the formation of a floating gate on said first insulating film;

forming a second insulating film on said first conductive film;

forming a second conductive film for protection on said second insulating film;

forming an etching-resistant film on said second conductive film;

removing those regions of said etching-resistant film, first and second conductive films, and first and second insulating films which are formed in said peripheral transistor region;

injecting a dopant into said peripheral transistor forming region, with a mask applied to said memory cell forming region;

forming a gate insulating film for said peripheral transistor by thermal oxidation in the peripheral transistor forming region;

removing said etching-resistant film from the memory cell forming region; and forming a third conductive film, which will become a control gate of the memory cell and a gate of the peripheral transistor, on the second conductive film and the peripheral transistor forming region.

50. The method of manufacturing a non-volatile semiconductor memory device according to claim 49, wherein said second conductive film and said third conductive film are integrated to function as a control gate.

51. The method of manufacturing a non-volatile semiconductor memory device according to claim 49, wherein each of said first, second and third conductive films is formed of polysilicon.

52. The method of manufacturing a non-volatile semiconductor memory device according to claim 49, wherein said second insulating film is of a three-layer structure including a central $Si_3N_4$ film and two $SiO_2$ films having said $Si_3N_4$ film interposed therebetween.

53. The method of manufacturing a non-volatile semiconductor memory device according to claim 49, wherein said washing-resistant film is made of $Si_3N_4$.

* * * * *